(12) United States Patent
Ohkoshi et al.

(10) Patent No.: US 9,079,782 B2
(45) Date of Patent: Jul. 14, 2015

(54) TITANIUM OXIDE PARTICLES, PROCESS FOR PRODUCING SAME, MAGNETIC MEMORY, OPTICAL INFORMATION RECORDING MEDIUM, AND CHARGE ACCUMULATION TYPE MEMORY

(75) Inventors: Shin-ichi Ohkoshi, Tokyo (JP); Hiroko Tokoro, Tokyo (JP); Fumiyoshi Hakoe, Tokyo (JP); Yoshihide Tsunobuchi, Tokyo (JP); Kazuhito Hashimoto, Tokyo (JP)

(73) Assignee: The University of Tokyo, Tokyo (JP)

( * ) Notice: Subject to any disclaimer, the term of this patent is extended or adjusted under 35 U.S.C. 154(b) by 110 days.

(21) Appl. No.: 13/699,082

(22) PCT Filed: Apr. 15, 2011

(86) PCT No.: PCT/JP2011/059344
§ 371 (c)(1),
(2), (4) Date: Jan. 17, 2013

(87) PCT Pub. No.: WO2011/145416
PCT Pub. Date: Nov. 24, 2011

(65) Prior Publication Data
US 2013/0105723 A1    May 2, 2013

(30) Foreign Application Priority Data

May 21, 2010 (JP) .................. 2010-117342

(51) Int. Cl.
| | |
|---|---|
| *C01G 23/00* | (2006.01) |
| *C01G 23/04* | (2006.01) |
| *C09C 1/36* | (2006.01) |
| *B82Y 10/00* | (2011.01) |
| *B82Y 25/00* | (2011.01) |
| *B82Y 40/00* | (2011.01) |
| *H01L 21/28* | (2006.01) |
| *H01L 43/10* | (2006.01) |
| *B82Y 30/00* | (2011.01) |

(52) U.S. Cl.
CPC .............. *C01G 23/04* (2013.01); *B82Y 10/00* (2013.01); *B82Y 25/00* (2013.01); *B82Y 30/00* (2013.01); *B82Y 40/00* (2013.01); *C01G 23/043* (2013.01); *C09C 1/36* (2013.01); *C09C 1/3607* (2013.01); *H01L 21/28273* (2013.01); *H01L 43/10* (2013.01); *C01P 2002/72* (2013.01); *C01P 2002/76* (2013.01); *C01P 2002/77* (2013.01); *C01P 2004/04* (2013.01); *C01P 2004/64* (2013.01); *C01P 2006/10* (2013.01); *C01P 2006/40* (2013.01); *C01P 2006/42* (2013.01)

(58) Field of Classification Search
None
See application file for complete search history.

(56) References Cited

U.S. PATENT DOCUMENTS 8,609,261 B2 * 12/2013 Ohkoshi et al. .............. 428/800

FOREIGN PATENT DOCUMENTS

| EP | 1431351 A1 * | 6/2004 |
|---|---|---|
| JP | 04-224113 A | 8/1992 |
| JP | 2003-238156 A | 8/2003 |
| JP | 2005120470 A * | 5/2005 |
| JP | 2010-024111 A | 2/2010 |
| JP | 2011236060 A | 11/2011 |
| JP | 5549939 B | 7/2014 |
| WO | WO-2010064575 A1 | 6/2010 |
| WO | WO 2010064575 A1 * | 6/2010 |

OTHER PUBLICATIONS

Notification of Reasons for Rejection, issued in corresponding Japanese Patent Application No. JP 2010-117342, dated Aug. 5, 2014.
Masashige Onoda "Phase Transitions of $Ti_3O_5$;" Journal of Solid State Chemistry, vol. 136, 67-73 (1998).
C. Hauf et al. "Preparation of Various Titanium Suboxide Powders by Reduction of $TiO_2$ with Silicon;" Journal of Materials Science, vol. 34, 1287-1292 (1999).
Hitoshi Sato et al. "Ti 3d Orbital Change Across Metal-Insulator Transition in $Ti_2O_3$: Polarization-Dependent Sodt X-ray Absorption Spectroscopy at Ti 2p Edge;" Journal of the Physical Society of Japan, vol. 75, 053702-1-053702-4, No. 5 (2006).
International Search Report dated Jul. 19, 2011, issued for PCT/JP2011/059344.

* cited by examiner

*Primary Examiner* — Steven Bos
(74) *Attorney, Agent, or Firm* — Locke Lord LLP; James E. Armstrong, IV

(57) ABSTRACT

A titanium oxide particle that can develop non-conventional and novel physical properties, a method for manufacturing the same, and a magnetic memory, an optical information recording medium, and a charge accumulation type memory using the same are provided. A silica-coated titanium hydroxide compound particle is directly produced through a sol-gel technique and not through a reverse micelle technique, and the silica-coated titanium hydroxide compound particle is subjected to a calcination process. Hence, a titanium oxide particle 1 can be provided which can develop non-conventional and novel physical properties such that it does not perform phase transition at a room temperature and a $Ti_3O_5$ particle body can always maintain the characteristic as a paramagnetic metal in all temperature ranges unlike conventional bulk bodies that perform phase transition between a non-magnetic semiconductor and a paramagnetic metal at a temperature near about 460 K.

3 Claims, 15 Drawing Sheets

ORTHORHOMBIC CRYSTAL Cmcm
*a* = 3.798(2) Å
*b* = 9.846(3) Å
*c* = 9.988(4) Å
*d* = 3.977 g/cm³

MONOCLINIC CRYSTAL C2/m
*a* = 9.835(1) Å
*b* = 3.794(1) Å
*c* = 9.9824(9) Å
*β* = 90.720(9)°
*d* = 3.988 g/cm³

• λ-$Ti_3O_5$

MONOCLINIC CRYSTAL C2/m
$a$ = 9.748(1) Å
$b$ = 3.8013(4) Å
$c$ = 9.4405(7) Å
$\beta$ = 91.529(7)°
$d$ = 4.249 g/cm³

TITANIUM OXIDE PARTICLES, PROCESS FOR PRODUCING SAME, MAGNETIC MEMORY, OPTICAL INFORMATION RECORDING MEDIUM, AND CHARGE ACCUMULATION TYPE MEMORY

CROSS REFERENCE TO RELATED APPLICATIONS

This application is a 371 US National Phase Application of PCT/JP2011/059344 filed Apr. 15, 2011, which claims priority to Japanese Patent Application No. JP2010-117342, filed May 21, 2010, the disclosures of each of which are expressly incorporated herein by reference in their entireties.

TECHNICAL FIELD

The present invention relates to a titanium oxide particle, a method for producing the same, a magnetic memory, an optical information recording medium and a charge accumulation type memory, and is suitable when applied to an oxide containing, for example, $Ti^{3+}$ (hereinafter, simply referred to as a titanium oxide).

BACKGROUND ART

For example, $Ti_2O_3$ typical of titanium oxide is a phase transition material having various interesting physical properties, and is known that it causes a metal-insulator transition or a paramagnetic-antiferromagnetic transition, etc. Moreover, $Ti_2O_3$ is also known with infrared absorption, a thermoelectric effect, and a magneto-electric (ME) effect, etc., and in addition, a magneto-resistance (MR) effect is also found in recent years. Such various physical properties are researched only through a bulk body (in ~μm size) (see, for example, Non-patent Literature 1), and most of such mechanisms are still unclear yet.

CITATION LIST

Patent Literature

Non-patent Literature 1: Hitoshi SATO et al., JOURNAL OF THE PHYSICAL SOCIETY OF JAPAN, Vol. 75, No. 5, May, 2006, pp. 053702/1-4

SUMMARY OF INVENTION

Technical Problem

Meanwhile, regarding a conventional technique for synthesizing such titanium oxide, a base material is calcined at a temperature of about 1600° C. in a vacuum condition, carbon reduction is performed on $TiO_2$ at a temperature of about 700° C., and $TiO_2$, $H_2$, and $TiCl_4$ are calcined at a temperature of about 1000° C., thereby to synthesize a bulk body. There is no report about a nanoparticle (in nm size) of $TiO_x$ containing $Ti^{3+}$ so far, and a development of novel physical property can be expected by making such a material to be a nanoparticle.

The present invention has been made in view of the above-explained circumstances, and it is an object of the present invention to provide a titanium oxide particle that can develop a non-conventional and novel physical property, a method for producing the same, and, a magnetic memory, an optical information recording medium and a charge accumulation type memory using the same.

Solution to Problem

To accomplish the above object, the present invention relates to a titanium oxide particle that includes: a $Ti_3O_5$ particle body in a microparticle shape formed of $Ti_3O_5$, the $Ti_3O_5$ being produced by calcining a silica-coated titanium hydroxide compound particle separated from a mixture solution, the silica-coated titanium hydroxide compound particle and being produced by adding a silane compound to the mixture solution, the mixture solution being prepared by mixing a titanium chloride aqueous solution with an ammonium aqueous solution, and the $Ti_3O_5$ particle body having a surface thereof coated with silica glass.

According to the present invention set forth in claim 2, the $Ti_3O_5$ particle body maintains a paramagnetic metal state in a temperature range from 0 to 800 K, and becomes an orthorhombic crystalline structure in the paramagnetic metal state in a temperature range of equal to or higher than at least 500 K, and becomes a monoclinic crystalline structure in the paramagnetic metal state in a temperature range of equal to or lower than at least 300 K.

According to the present invention, the silica glass coating the $Ti_3O_5$ particle body is removed.

The present invention relates to a method for producing a titanium oxide particle which includes: a step of mixing a titanium chloride aqueous solution with an ammonium aqueous solution to prepare a mixture solution, and of produce a titanium hydroxide compound particle in the mixture solution; a step of adding a silane compound to the mixture solution to produce a silica-coated titanium hydroxide compound particle; and a step of calcining the silica-coated titanium hydroxide compound particle separated from the mixture solution to produce a $Ti_3O_5$ particle body in a microparticle shape which is coated with silica glass.

The present invention includes a step of removing the silica glass coating the $Ti_3O_5$ particle body.

According to the present invention, in the step of removing the silica glass, the silica glass is removed from the surface of the $Ti_3O_5$ particle body by at least one of followings: a potassium hydroxide solution in ethanol; a sodium hydroxide aqueous solution; or a tetramethylammonium hydroxide aqueous solution.

The present invention relates to a magnetic memory that includes: a magnetic layer formed by fixing a magnetic material on a supporting body, and the magnetic material being formed of the titanium oxide particle according to the present invention described above.

The present invention relates to an optical information recording medium which records information in a recording layer by focusing recording light for recording in the recording layer, and which reproduces the information recorded in the recording layer based on a difference in a reflectivity of return light that returns from the recording layer by focusing reading light for reading in the recording layer, the optical information recording medium including: the recording layer formed of the titanium oxide particle according to the present invention described above.

The present invention relates to a charge accumulation type memory comprising a charge accumulating layer formed by fixing a charge accumulating material on a supporting body, and the charge accumulating material being formed of the titanium oxide particle according to the present invention described above.

Advantageous Effects of Invention

According to the present invention described above, a titanium oxide particle that can develop a non-conventional and novel physical property can be provided.

According to the present invention described above, a magnetic memory using the titanium oxide particle that can develop a non-conventional and novel physical property as a magnetic material can be provided.

According to the present invention described above, an optical information recording medium using the titanium oxide particle that can develop a non-conventional and novel physical property in a recording layer can be provided. Moreover, According to the present invention described above, a charge accumulation type memory using the titanium oxide particle that can develop a non-conventional and novel physical property as a charge accumulation material can be provided.

REFERENCE SIGNS LIST

1 Titanium oxide particle
2 $Ti_3O_5$ particle body
3 Silica glass
4 Microstructure
10 Titanium hydroxide compound particle
11 Silica
12 Silica-coated titanium hydroxide compound particle

DESCRIPTION OF EMBODIMENTS

An explanation will now be given of an embodiment of the present invention with reference to the accompanying drawings.

(1) Structure of Titanium Oxide Particle

Figure 1:
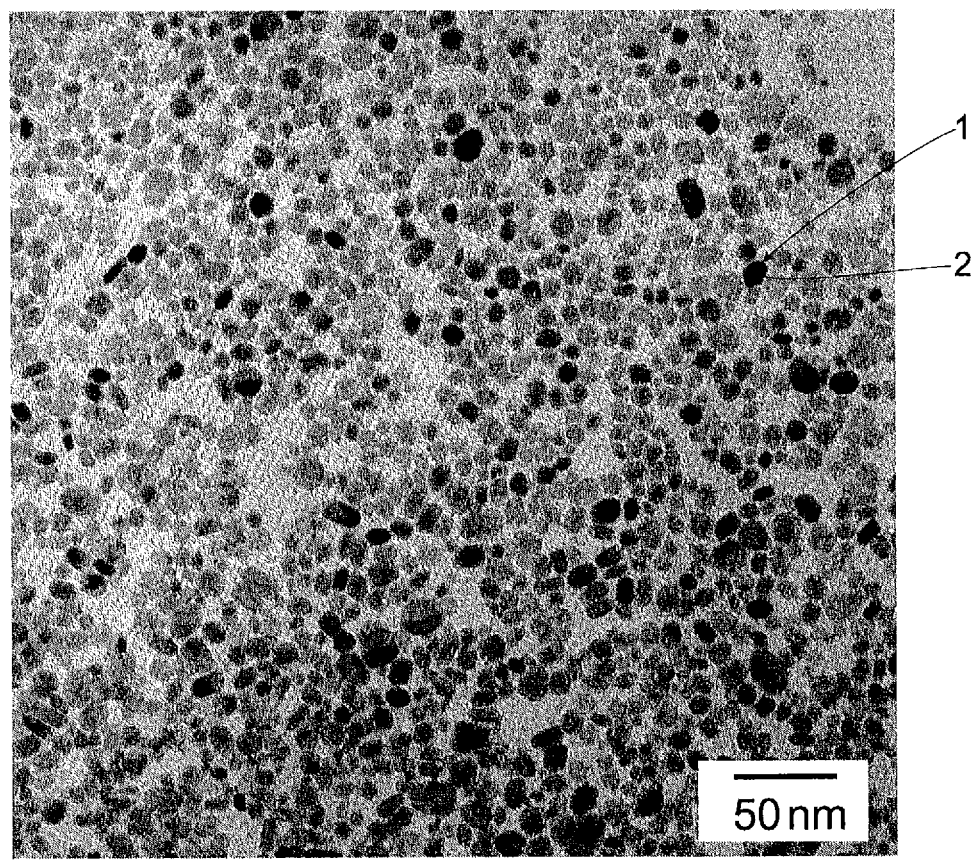
FIG. 1 is a TEM image showing a structure of a titanium oxide particle according to the present invention.

FIG. 1 is a TEM image of a titanium oxide particle 1 picked up by a Transmission Electron Microscope (TEM), and a plurality of titanium oxide particles 1 are not bonded together but dispersed. The plurality of titanium oxide particles 1 have a uniform size that is a particle diameter of about 6 to 10 nm, and are each formed of $Ti_3O_5$ particle body 2 in a nano size formed in substantially same particle shape, such as a cubic shape, a spherical shape, or an elliptical shape.

FIG. 1 is a TEM image of a titanium oxide particle 1 having a particle diameter of about 6 to 10 nm, but according to the present invention, a titanium oxide particle 1 having a particle diameter of about 6 to 40 nm is also producible. Moreover, in FIG. 1, in order to clarify the size and shape of each titanium oxide particle 1 in the TEM image, a dispersion liquid containing tetramethylammonium hydroxide (TMAH) was used to let the titanium oxide particles 1 dispersed.

In practice, such titanium oxide particles 1 have a composition of $Ti_3O_5$ in a pseudo-brookite structure, have a crystalline structure performing phase transition upon a change in a temperature, indicate a Pauli paramagnetism in all temperature ranges (e.g., a temperature range from 0 to 800 K), and can maintain a paramagnetic metal state. Hence, the titanium oxide particle 1 of the present invention has a non-conventional feature such that it can maintain a paramagnetic metal state even in a temperature range of less than about 460 K where a bulk body of $Ti_3O_5$ conventionally known (hereinafter, referred to as a conventional crystal) performs phase transition to a non-magnetic semiconductor.

In practice, the titanium oxide particle 1 can be a monoclinic crystalline phase (hereinafter, referred to as a $\lambda$ phase) that has $Ti_3O_5$ maintaining the paramagnetic metal state in a temperature range equal to or lower than about 300 K. This titanium oxide particle 1 starts phase transition from a temperature that exceeds about 300 K, becomes a multiphase state of the $\lambda$ phase and an orthorhombic $\alpha$ phase in the paramagnetic metal state, and has the crystalline structure becoming only the $\alpha$ phase in a temperature range exceeding about 500 K.

Figure 2B:
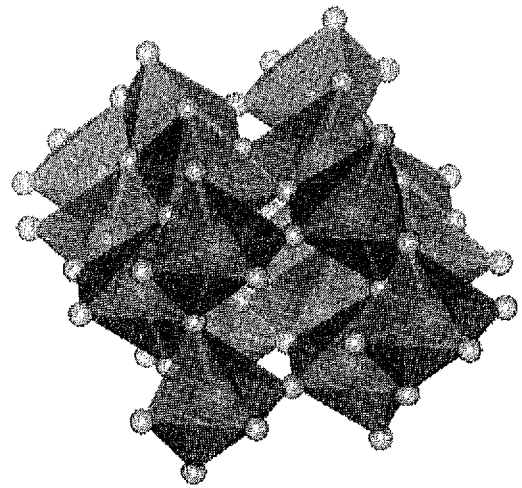
FIG. 2 are schematic views showing a crystalline structure of $\lambda$-$Ti_3O_5$ and a crystalline structure of $\alpha$-$Ti_3O_5$.
Figure 2A:
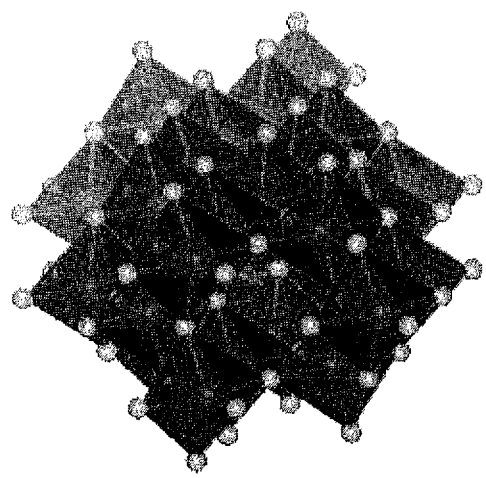

According to this embodiment, the $Ti_3O_5$ particle body 2 in a temperature range of equal to or lower than about 300 K becomes $Ti_3O_5$ (hereinafter, referred to as $\lambda$-$Ti_3O_5$) which has, as shown in FIG. 2A, a crystalline structure belonging to a space group of C2/m, has a lattice constant of a=9.835 (1) Å, b=3.794 (1) Å, c=9.9824 (9) Å, $\beta$=90.720 (9)°, and a density of unit cell d=3.988 g/cm³. In contrast, the $Ti_3O_5$ particle body 2 in a temperature range of equal to or higher than about 500 K becomes $\alpha$-$Ti_3O_5$ which has, as shown in FIG. 2B, a crystalline structure belonging to a space group of Cmcm, a lattice constant of a=3.798 (2) Å, b=9.846 (3) Å, c=9.988 (4) Å, and d=3.977 g/cm³.

The titanium oxide particle 1 of the present invention has a feature that it is formed of a microstructure (to be discussed later) produced through a sol-gel technique and a calcination process only without the aid of a reverse micelle technique unlike the production method (hereinafter, simply referred to as a conventional production method) disclosed in PCT/JP2009/69973 by the inventors of the present invention.

(2) Production Method of Titanium Oxide Particle

Figure 3:
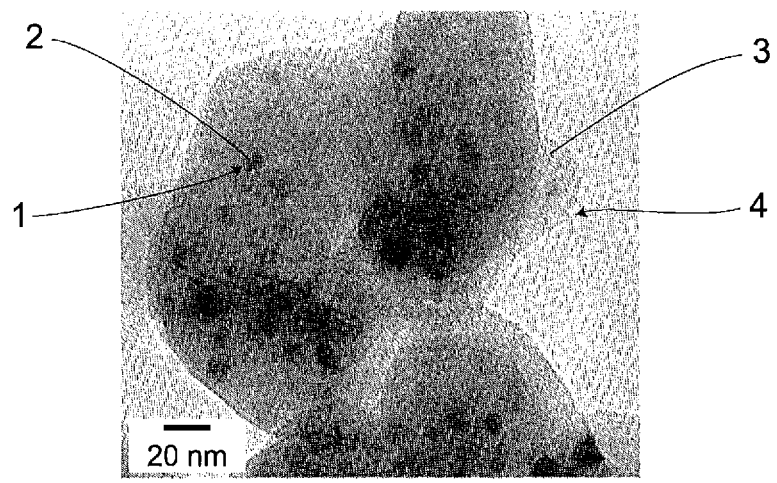
FIG. 3 is a TEM image showing a structure of a microstructure having a titanium oxide particle formed in silica glass.

According to the present invention, first of all, as shown in FIG. 3, a microstructure 4 formed by letting a plurality of titanium oxide particles 1 dispersed in silica glass 3 of amorphous structure is produced through a sol-gel technique and a calcination process. Next, the silica glass 3 in the microstructure 4 is removed to take out the plurality of titanium oxide particles 1 only from the silica glass 3, thereby producing the titanium oxide particles 1 in a microparticle shape having the whole surface of the $Ti_3O_5$ particle body 2 revealed to the exterior.

In the following explanation, first, as shown in FIG. 3, a method of producing the titanium oxide particles 1 coated with silica glass 3 will be explained, and then a separation process for separating the titanium oxide particles 1 from the silica glass 3 will be explained.

(2-1) Production Method of Titanium Oxide Particle Coated with Silica Glass

FIG. 3 is a TEM image of the microstructure 4 produced through the production method of the present invention and picked up by a Transmission Electron Microscope (TEM), and the titanium oxide particles 1 having a uniform particle diameter of, for example, about 6 to 10 nm are dispersed and synthesized in the silica glass 3. The microstructure 4 having the titanium oxide particles 1 formed so as to be coated with the silica glass 3 can be produced through a sol-gel technique and a calcination process without a reverse micelle technique as will be explained below.

In this case, first, a titanium chloride aqueous solution having titanium chloride dissolved in water is prepared. More specifically, titanium tetrachloride ($TiCl_4$) is used as the titanium chloride, and a titanium chloride aqueous solution having a titanium tetrachloride concentration of, for example, about 31 mmol/dm$^{-3}$ is prepared. Next, separately from this titanium chloride aqueous solution, ammonium ($NH_3$) is dissolved in water to prepare an ammonium aqueous solution having an ammonium concentration of, for example, about 13 mol/dm$^{-3}$.

Figure 4:
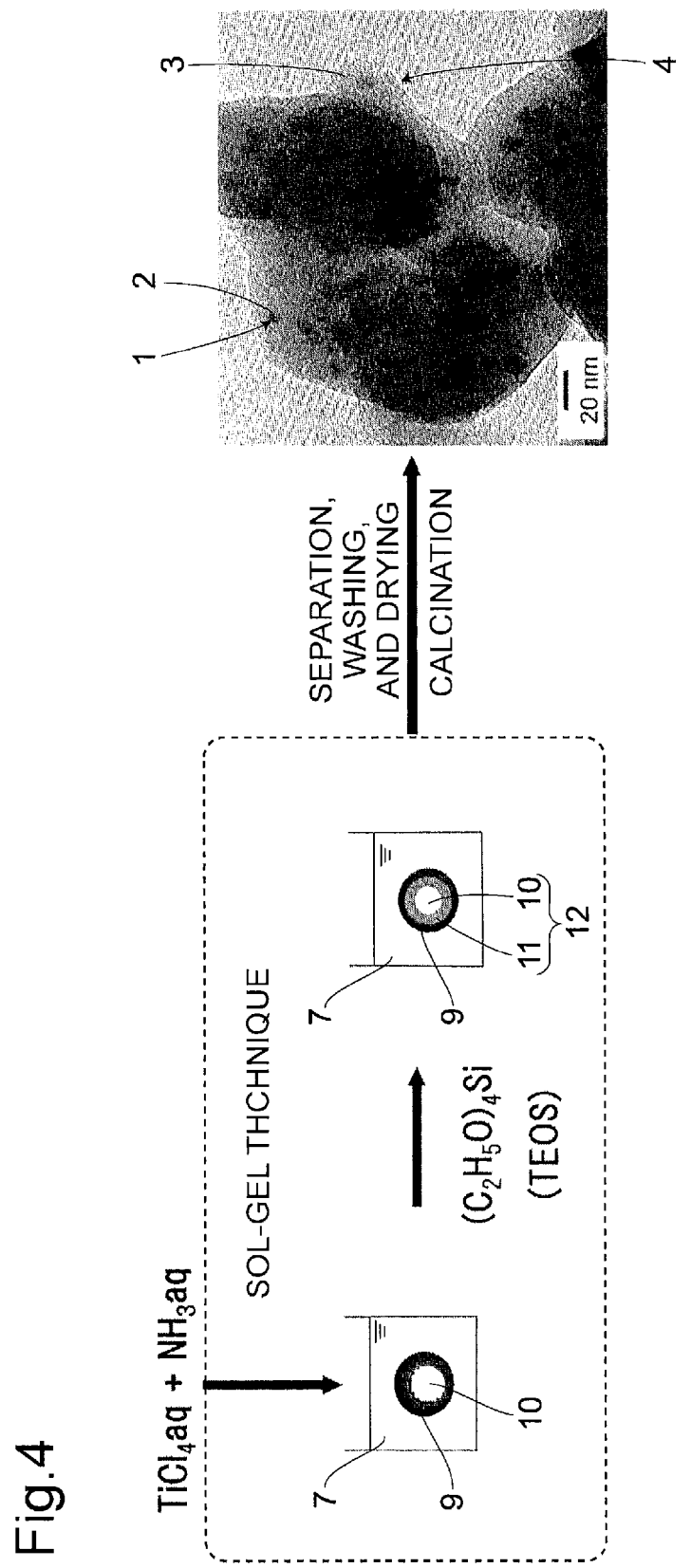
FIG. 4 is a schematic view for explaining how to produce a microstructure.

Next, as shown in FIG. 4, the titanium chloride aqueous solution ($TiCl_4$aq) and the ammonium aqueous solution ($NH_3$aq) are mixed and stirred to prepare a mixture solution 7 in a sol form. At this time, a hydroxylation reaction occurs in a water phase, and titanium hydroxide compound particles 10 formed of $Ti(OH)_4$ are produced in a water phase 9 of the mixture solution 7.

Next, a solution of a silane compound, such as tetraethoxysilane (TEOS (($C_2H_5O)_4Si$)), is added to the mixture solution 7 accordingly. Hence, a hydrolysis reaction occurs in the mixture solution 7, and after, for example, 20 hours has elapsed, the reaction further progresses, and thus a silica-coated titanium hydroxide compound particle 12 having a surface of a titanium hydroxide compound particle 10 coated with silica 11 can be produced in the mixture solution 7 that has become a gel. As explained above, according to the present invention, the silica-coated titanium hydroxide compound particles 12 can be directly produced through the process of a sol-gel technique only without through the process of a reverse micelle technique.

Subsequently, a centrifugal separation is performed to remove the silica-coated titanium hydroxide compound particles 12 from the mixture solution 7, and the silica-coated titanium hydroxide compound particles are washed and let dried, thereby extracting the silica-coated titanium hydroxide compound particles 12 ($Ti(OH)_4$ microparticles coated with silica 11) from the mixture solution 7.

Next, the dried silica-coated titanium hydroxide compound particles 12 ($Ti(OH)_4$ microparticles coated with silica 11) are subjected to a calcination process under a hydrogen atmosphere (0.3 to 1.5 L/min, preferably, about 0.3 L/min) at a predetermined temperature (about 1050 to 1250° C., preferably, about 1163° C.) for a predetermined time period (about five hours). Through this calcination process, the silica-coated titanium hydroxide compound particles 12 reduce $Ti^{4+}$ due to an reduction reaction in the silica shell, and $Ti_3O_5(Ti^{3+}_2Ti^{4+}O_5)$ particle body that is an reduction product containing $Ti^{3+}$ is produced in the silica 11.

Hence, a microstructure 4 having a plurality of titanium oxide particles 1 each formed of $Ti_3O_5$ particle body 2 that is microparticles with a uniform particle diameter and dispersed in the silica glass 3 can be produced. Note that the coating by the silica 11 also suppresses any sintering of particles together.

(2-2) Analysis of Titanium Oxide Particle Coated with Silica Glass

Figure 5:
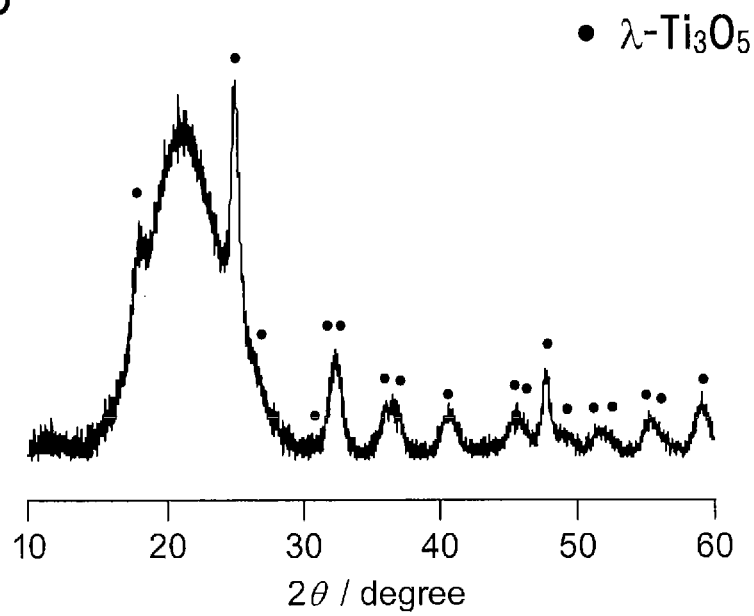
FIG. 5 is a graph showing an analysis result of an XRD pattern of a microstructure.

An XRD pattern for the titanium oxide particles 1 coated with the silica glass 3 and produced thus way was measured at a room temperature, and an analysis result shown in FIG. 5 was obtained. FIG. 5 has a horizontal axis that indicates a diffraction angle, and a vertical axis that indicates a diffraction X-ray intensity. As shown in FIG. 5, according to this XRD pattern, a peak indicating $SiO_2$ (silica) is present, and thus it is confirmed that the microstructure 4 contains the silica 11. Moreover, according to this XRD pattern, when a portion where a distinctive peak appears is indicated by a "black circle" mark, such an XRD pattern differs from the XRD pattern (unillustrated) of $\alpha$-$Ti_3O_5$, and thus it is confirmed that the crystalline structure of the titanium oxide particles 1 coated with the silica glass 3 is not $\alpha$-$Ti_3O_5$.

Figure 6:
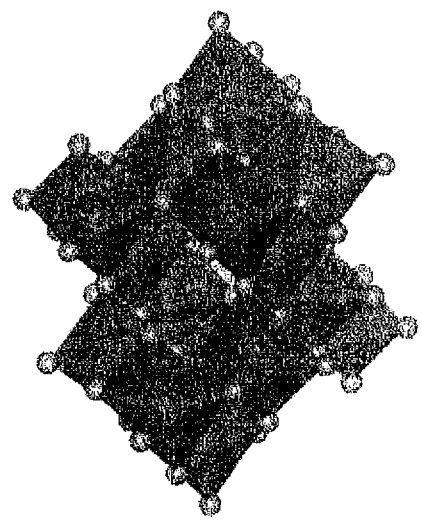
FIG. 6 is a schematic view showing a crystalline structure of $\beta$-$Ti_3O_5$.

Since this XRD pattern has a characteristic peak substantially matching the peak of $\lambda$-$Ti_3O_5$ defined in PCT/JP2009/69973 (see FIG. 6 showing a conventional production method) by the inventors of the present invention, it can be confirmed that $\lambda$-$Ti_3O_5$ can be produced through the above-explained "(2-1) Production Method of Titanium Oxide Particle Coated with Silica Glass" like the conventional production method.

Meanwhile, conventional crystals (a conventionally known bulk body formed of $Ti_3O_5$) are phase-transition substances, and it is confirmed that when the temperature is higher than about 460 K, the crystalline structure becomes $\alpha$-$Ti_3O_5$ (a phase), and when the temperature is lower than about 460 K, the crystalline structure becomes $\beta$-$Ti_3O_5$($\beta$ phase). That is, as shown in FIG. 6, the conventional crystals in the temperature range of lower than about 460 K have a crystalline structure belonging to a space group of C2/m, and become $\beta$-$Ti_3O_5$ having a lattice constant of a=9.748 (1) Å, b=18013 (4) Å, c=9.4405 (7) Å, $\beta$=91.529 (7)°, and d=4.249 g/cm$^3$.

The conventional crystals having become $\beta$ phase in the temperature range lower than about 460 K have a monoclinic crystalline structure, and become a Curie paramagnetic due to a lattice defect near 0 K to have a slight magnetism, but become non-magnetic ions in a temperature range lower than 460 K, and may become a non-magnetic semiconductor.

As explained above, as shown in FIG. 2A, $\lambda$-$Ti_3O_5$ that is a composition of the titanium oxide particles 1 of the present invention has a crystalline structure different from the crystalline structure of $\beta$-$Ti_3O_5$, and thus it is clear that $\lambda$-$Ti_3O_5$ is different from $\beta$-$Ti_3O_5$.

(2-3) Separation Process of Separating Titanium Oxide Particle from Silica Glass Next, an explanation will be given of a separation process of removing the silica glass 3 coating the titanium oxide particles 1 in the microstructure 4 produced as explained above, and of separating and taking out the titanium oxide particles 1 from the silica glass 3.

Figure 7:
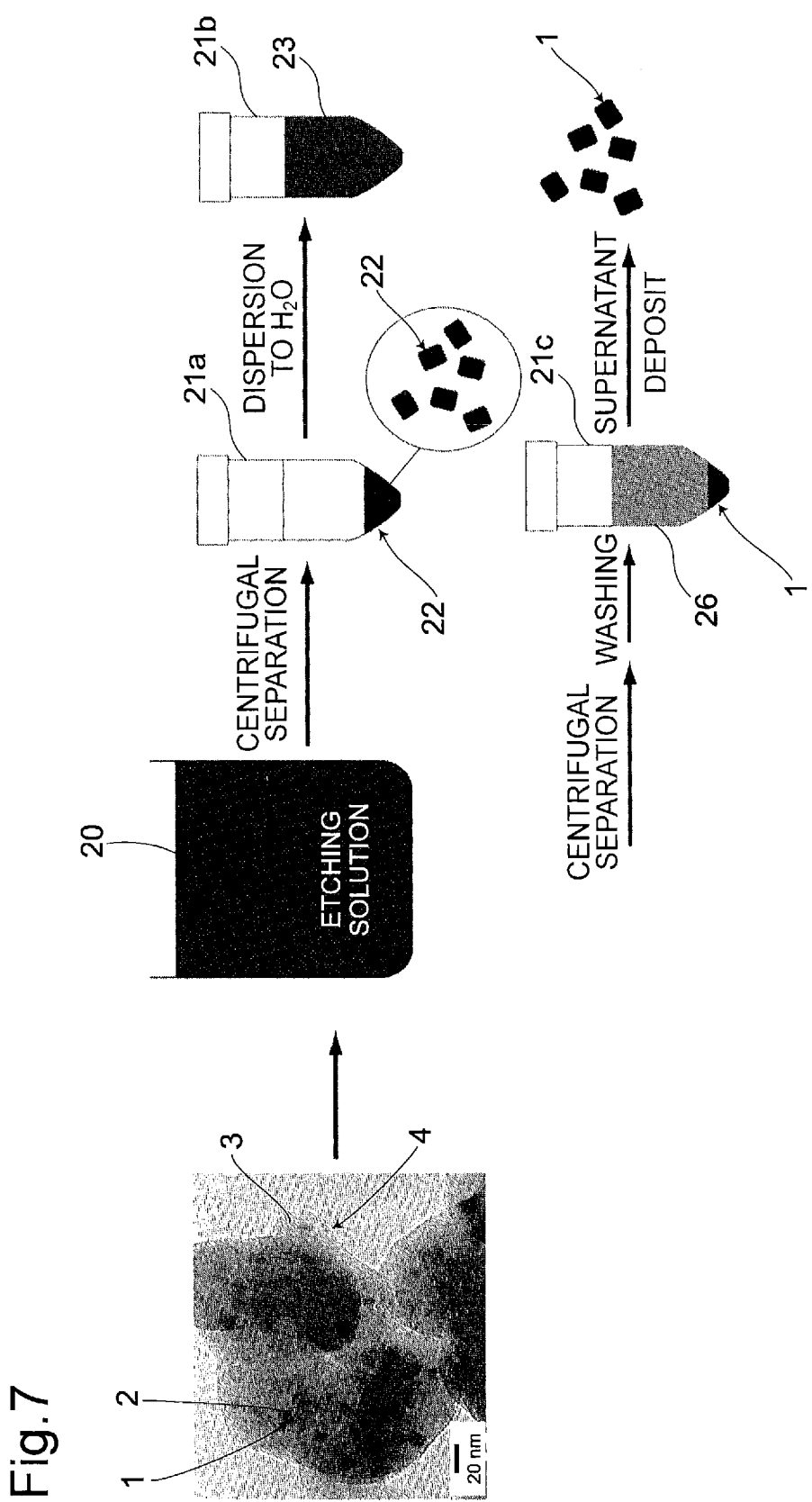
FIG. 7 is a schematic view for explaining a separation process of separating a titanium oxide particle from silica glass.

In this case, as shown in FIG. 7, first, as an etching solution, a potassium hydroxide solution in ethanol (potassium hydroxide concentration: 0.1 mol/dm$^{-3}$) (KOH/EtOH) having, for example, potassium hydroxide dissolved in ethanol is prepared. Next, the microstructure 4 produced through the above-explained production method is added in this potassium hydroxide solution in ethanol 20, the temperature of the potassium hydroxide solution in ethanol 20 is maintained to about 50° C., and those are left as those are for about 24 hours, thereby removing the silica glass 3 coating the whole surfaces of the titanium oxide particles 1 from the surfaces of the titanium oxide particles 1.

Thereafter, the potassium hydroxide solution in ethanol 20 added with the microstructure 4 is subjected to a centrifugal separation at 15000 rpm for about 10 minutes, and precipitates 22 in a container(flask) 21a are collected. Next, the precipitates 22 are added in an aqueous solution 23 and let dispersed, and a centrifugal separation is again performed at 26000 rpm for about 10 minutes to collect the precipitates in a container 21b. The precipitates are washed twice by water and once by ethanol. Subsequently, the titanium oxide particles 1 produced separately from a supernatant fluid 26 in a container 21c are collected and the separation process is terminated.

According to the above-explained embodiment, the explanation was given of an example case in which the potassium hydroxide solution in ethanol 20 is applied as the etching solution, but the present invention is not limited to this case. For example, a sodium hydroxide aqueous solution, tetramethylammonium hydroxide aqueous solution, or a mixture thereof, or other various kinds of etching solutions is applicable as long as the silica glass 3 can be removed from the surface of the titanium oxide particles 1.

When, for example, a sodium hydroxide aqueous solution is applied as the etching solution, the microstructure 4 is added in the sodium hydroxide aqueous solution (sodium hydroxide concentration: 3 mol/dm$^{-3}$), the temperature of the sodium hydroxide aqueous solution is maintained to about 50° C., and those are left as those are for about six hours, thereby removing the silica glass 3 coating the whole surfaces of the titanium oxide particles 1 from the surfaces of the titanium oxide particles 1.

When a tetramethylammonium hydroxide aqueous solution is applied as the etching solution, the microstructure 4 is added in the tetramethylammonium hydroxide aqueous solution (tetramethylammonium hydroxide 1 mol/dm$^{-3}$), the temperature of the tetramethylammonium hydroxide aqueous solution is maintained to about 70° C., and those are left as those are for about 48 hours, thereby removing the silica glass 3 coating the whole surfaces of the titanium oxide particles 1 from the surfaces of the titanium oxide particles 1.

(3) Characteristic of Titanium Oxide Particle

The titanium oxide particles 1 having the silica glass 3 removed through the above-explained production method have following characteristics.

Figure 8:
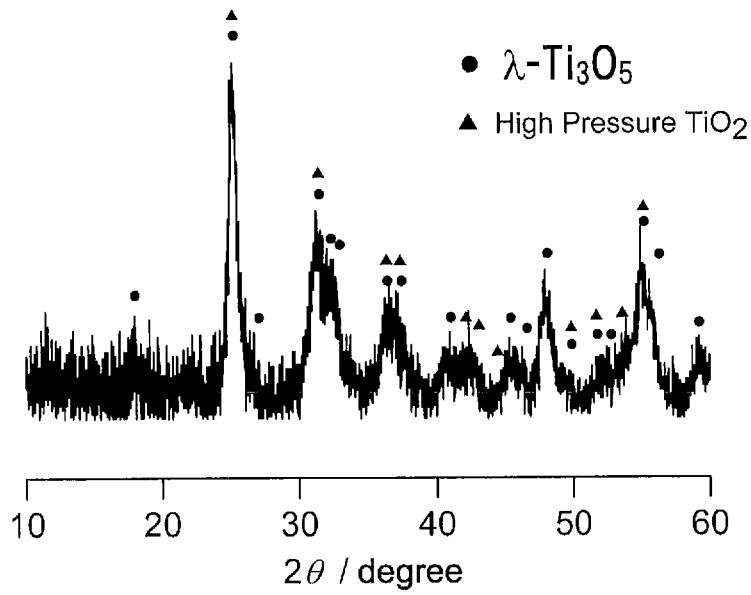
FIG. 8 is a graph showing an analysis result of an XRD pattern of a titanium oxide particle having silica glass removed.

(3-1) X-Ray Diffraction (XRD) Measurement of Titanium Oxide Particle Separated from Silica Glass at Room Temperature When an XRD pattern for the titanium oxide particles 1 having the silica glass 3 removed was measured at a room temperature, an analysis result shown in FIG. 8 was obtained. FIG. 8 has a horizontal axis that indicates a diffraction angle, and a vertical axis indicating a diffraction X-ray intensity. As shown in FIG. 8, when a portion where a characteristic peak appears is indicated by a "black circle" mark in this XRD pattern, it can be confirmed that substantially same peak as that of the microstructure 4 shown in FIG. 5 appears other than a fact that no peak indicating $SiO_2$ (silica) appears.

That is, it can be confirmed that the XRD pattern of the titanium oxide particles 1 having the silica glass 3 removed is different from the XRD pattern (unillustrated) of $\alpha$-$Ti_3O_5$. Moreover, a peak (indicated by a "black triangle" mark in FIG. 8) which is the same as $TiO_2$ and called a High-pressure phase also appears in this XRD pattern, and it can be confirmed that this High-pressure-phase $TiO_2$ is developed by 40% or so.

It is confirmed that the conventional crystals in the extremely narrow temperature range around about 460 K become a crystalline structure different from both $\alpha$ phase and $\beta$ phase. An analysis for an XRD pattern of this crystalline structure is performed, and a characteristic peak in this XRD pattern is checked with a characteristic peak of the XRD patterns in FIGS. 5 and 8. In this case, such a characteristic peak substantially matches the peak of the XRD pattern of $\lambda$-$Ti_3O_5$ of the present invention. Hence, according to the titanium oxide particles 1 of the present invention, it becomes clear that $\lambda$-$Ti_3O_5$ that develops only in the extremely narrow temperature range around about 460 K in the cases of the conventional crystals stably develops in the wide temperature range from about 0 to 300 K.

Figure 9:
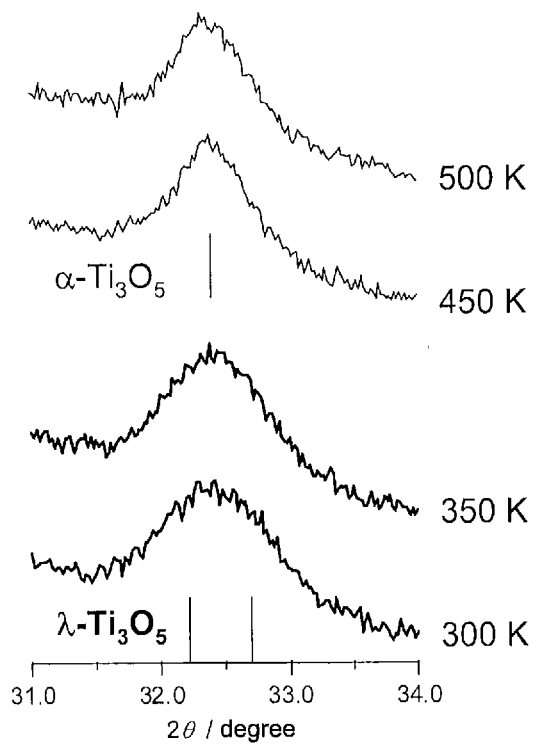
FIG. 9 is a graph showing an analysis result of an XRD pattern of a titanium oxide particle at each temperature of 300 K, 350 K, 450 K, and 500 K.

(3-2) Temperature Dependency of $\lambda$ Phase and $\alpha$ Phase in Titanium Oxide Particle Next, respective XRD patterns of the titanium oxide particles 1 at respective temperatures of 300 K, 350 K, 450 K, and 500 K were measured, and analysis results shown in FIG. 9 were obtained. It can be confirmed from FIG. 9 that the titanium oxide particle 1 is in a $\lambda$ phase at a room temperature, and when the temperature rises, the crystalline phase becomes an $\alpha$ phase only at a high temperature range of equal to or higher than at least about 450 K. That is, according to the titanium oxide particle 1 of the present invention, within a temperature range from 0 to 800 K, the crystalline phase becomes a $\lambda$ phase in a lower temperature range in the former temperature range, and the crystalline phase becomes an $\alpha$ phase only in a higher temperature range of equal to or higher than at least about 450 K. Moreover, according to the titanium oxide particle 1, when it becomes only the $\alpha$ phase by heating, if it is cooled to a lower temperature range again, the $\lambda$ phase is recovered, and thus both $\lambda$ phase and $\alpha$ phase develop depending on the temperature.

(3-3) Magnetic Characteristic of Titanium Oxide Particle

The conventional crystals become a $\beta$ phase when the temperature becomes in a temperature range lower than about 460 K. The conventional crystals have a monoclinic crystalline structure, and become Curie paramagnetic to have a slight magnetism due to a lattice defect near 0 K, but become non-magnetic ions in a temperature range lower than 460 K, and may become a non-magnetic semiconductor.

In contrast, according to the titanium oxide particle 1 of the present invention, unlike the conventional crystals, when a temperature is lowered from a high temperature, the crystalline structure does not perform phase transition to $\beta$-$Ti_3O_5$ near about 460 K, but performs phase transition to $\lambda$-$Ti_3O_5$, and indicates a behavior like a paramagnetic metal, thereby always maintaining the feature of the paramagnetic metal similar to $\alpha$-$Ti_3O_5$ in all temperature ranges. That is, since the crystalline structure performs phase transition from the $\alpha$ phase to the λ phase by the temperature change, the titanium oxide particle 1 of the present invention is Pauli paramagnetic in all temperature ranges from 0 to 800 K, and maintains a state indicating a behavior like a paramagnetic metal.

(3-4) Electric Resistance of Titanium Oxide Particle

When the crystalline structure is $\lambda\text{-}Ti_3O_5$, the titanium oxide particle 1 has an electric resistance similar to a metal even if it is a semiconductor, and $\alpha\text{-}Ti_3O_5$ that develops in a predetermined temperature range also has substantially same electric resistance as that of $\lambda\text{-}Ti_3O_5$.

(3-5) Pressure Effect of Titanium Oxide Particle

Moreover, according to the titanium oxide particle 1 of the present invention, when pressure is applied thereto, some of the crystalline structures perform phase transition from λ phase to β phase. Even if pressure applied is relatively small, the titanium oxide particle 1 performs phase transition from the λ phase to the β phase, and when the applied pressure increases, the ratio of the phase transition from the λ phase to the β phase gradually increases.

Moreover, when heat is applied to rise the temperature, the titanium oxide particle 1 partially having undergone phase transition to the β phase by an application of pressure causes the λ phase and the β phase to perform phase transition to a phase in a predetermined temperature range. Moreover, when cooled to have a temperature lowered again, the titanium oxide particle 1 having undergone such a phase transition to the α phase performs phase transition again to the λ phase. That is, according to the titanium oxide particle 1 of the present invention, the crystalline structure can be subjected to phase transition from the λ phase to the β phase by applying pressure, and the crystalline structure can further perform phase transition from the β phase to the α phase and further from the α phase to the λ phase again by changing the temperature.

(3-6) Irradiated Effect by Light of Titanium Oxide Particle

According to a pellet sample in a predetermined shape formed by applying predetermined pressure to a powder sample (hereinafter, referred to as a $\lambda\text{-}Ti_3O_5$ powder sample) formed of the plurality of titanium oxide particles 1, when irradiated with predetermined light, a portion of the pellet sample irradiated with light changes its color, and changes from $\lambda\text{-}Ti_3O_5$ to $\beta\text{-}Ti_3O_5$. As explained above, the titanium oxide particle 1 of the present invention has a characteristic of performing phase transition from the λ phase to the β phase induced by light upon irradiation with predetermined light at a room temperature.

(4) Action and Advantage

According to the above-explained structure, when a titanium chloride solution and an ammonium solution are mixed, the titanium hydroxide compound particles 10 in a microparticle shape formed of $Ti(OH)_4$ are produced in the mixture solution 7, and the silica-coated titanium hydroxide compound particles 12 can be produced in the mixture solution 7 through only the sol-gel technique of adding the solution of the silane compound to the mixture solution 7 accordingly.

After separated from the mixture solution 7, the silica-coated titanium hydroxide compound particles 12 are washed and let dried, and subjected to a calcination process at a predetermined temperature, thereby forming the titanium oxide particles 1 in a microparticle shape coated with the silica glass 3. As explained above, according to the production method of the present invention, the silica-coated titanium hydroxide compound particles 12 can be simply produced through only the sol-gel technique, and the titanium oxide particles 1 coated with the silica glass 3 can be produced by only performing a calcination process on the silica-coated titanium hydroxide compound particles 12.

According to PCT/JP2009/69973 by the inventors of the present invention, like the present invention, a titanium oxide particle which has the composition of $Ti_3O_5$, maintains the paramagnetic metal state in a temperature range from 0 to 800 K, and is coated with silica glass can be produced, but the reverse micelle technique is applied during the production process.

More specifically, according to the production method (the conventional production method) of PCT/JP2009/69973, in accordance with the reverse micelle technique, first, a surface acting agent (e.g., cetyltrimethylammonium bromide (CTAB $(C_{16}H_{33}N(CH_3)_3Br)$)) and titanium chloride are dissolved in a solution having an oil phase of octane and 1-butanol, and a raw-material micelle solution having a water phase 6 containing titanium chloride in the oil phase is prepared.

Moreover, according to this conventional production method, separately from the preparation of the raw-material micelle solution, in accordance with the reverse micelle technique, a surface acting agent and an ammonium aqueous solution are mixed in a solution having an oil phase of octane and 1-butanol, and a neutralizer micelle solution having a water phase 7 containing ammonium in the oil phase is prepared. Thereafter, the process transitions to a sol-gel technique, and those raw-material micelle solution and neutralizer micelle solution are mixed, thereby producing titanium hydroxide compound particles formed of $Ti(OH)_4$.

In contrast, according to the production method of the present invention, the above-explained reverse micelle technique is not applied, but the silica-coated titanium hydroxide compound particles 12 can be directly produced through the sol-gel technique. Accordingly, octane, 1-butanol, and the surface acting agent applied in the reverse micelle technique become unnecessary, and by what corresponds to such an unnecessity, the costs can be remarkably reduced up to about 1/30 to 1/40 in comparison with the conventional production method.

According to the production method of the present invention, the silica-coated titanium hydroxide compound particles 12 can be completely produced by utilizing water without a solution at all having an oil phase. Hence, a burden to the environment can be reduced. Moreover, the silica-coated titanium hydroxide compound particles 12 can be produced through only the simple sol-gel technique and without through the process of the reverse micelle technique, and thus a production burden can be reduced in comparison with the conventional production method, thereby enabling the mass-production.

According to the production method of the present invention, such titanium oxide particles 1 coated with the silica glass 3 are added in the potassium hydroxide solution in ethanol 20, and such a solution is left as it is for about 24 hours while maintaining the temperature of the potassium hydroxide solution in ethanol 20 to be about 50° C. Alternatively, the titanium oxide particles 1 coated with the silica glass 3 are added in a sodium hydroxide aqueous solution instead of the potassium hydroxide solution in ethanol 20, and such a solution is left as it is for about six hours while maintaining the temperature to be about 50° C. Furthermore, the titanium oxide particles 1 coated with the silica glass 3 are added in the tetramethylammonium hydroxide aqueous solution instead of the potassium hydroxide solution in ethanol 20, and such a solution is left as it is for about 48 hours while maintaining the temperature to be about 70° C.

Hence, according to the production method of the present invention, the silica glass 3 coating the whole surfaces of the titanium oxide particles 1 can be removed from the surfaces of the titanium oxide particles 1, and thus the titanium oxide particles 1 can be separated and taken out from the silica glass 3. Therefore, according to the present invention, the plurality of titanium oxide particles 1 can be produced which have respective surfaces not coated with the silica glass 3 but revealed to the exterior, and which are formed in a uniform microparticle shape having a relatively small particle diameter.

According to the production method of the present invention, during the production procedure, the surfaces of the titanium hydroxide compound particles 10 are coated with the silica 11 in the mixture solution 7. Accordingly, the titanium hydroxide compound particles 10 are formed so as to have a small particle diameter by the silica 11, and thus the titanium hydroxide compound particles 10 have a uniform and smooth surface with a little concavity and convexity. Hence, according to the production method of the present invention, the titanium hydroxide compound particles 10 are subjected to a calcination as those are, and the titanium oxide particles 1 are formed from such titanium hydroxide compound particles 10. Accordingly, the titanium oxide particles 1 can be formed so as to have a small particle diameter, and have a uniform and smooth surface with a little concavity and convexity. Therefore, according to this production method, by removing the silica glass 3 from the surfaces of the titanium oxide particles 1, the titanium oxide particles 1 can be produced which have a small particle diameter, have a uniform and smooth surface, and are formed of $Ti_3O_5$ particle body 2.

The titanium oxide particles 1 produced through such a production method become the λ phase in a low temperature range, but become the α phase in a high temperature range, and do not perform phase transition to the β phase which has a characteristic as a non-magnetic semiconductor but perform phase transition to the λ phase that is a monoclinic crystalline phase maintaining the paramagnetic metal state unlike the conventional crystals even if the titanium oxide particles become a temperature of equal to or lower than 460 K when the temperature is lowered from a high temperature to a low temperature. Therefore, the titanium oxide particles 1 of the present invention can always maintain the characteristic as the paramagnetic metal in a low temperature range of equal to or lower than 460 K.

As explained above, according to the present invention, it becomes possible to provide the titanium oxide particles 1 that can develop non-conventional and novel physical properties which indicate a behavior like a paramagnetic metal having a composition of $Ti_3O_5$ in all temperature ranges from 0 to 800 K, and which can always maintain a characteristic as the paramagnetic metal unlike the conventional bulk body that performs phase transition to the non-magnetic semiconductor and the paramagnetic metal at a temperature near about 460 K.

Such titanium oxide particles 1 can perform phase transition from the crystalline structure of $λ$-$Ti_3O_5$ to the crystalline structure of $β$-$Ti_3O_5$ upon application of pressure at a room temperature. Moreover, when the applied pressure is increased, the titanium oxide particles 1 have a ratio of phase transition from the λ phase to the β phase gradually increased, and thus the ratio between the λ phase and the β phase is adjustable by adjusting the applied pressure. Furthermore, when pressure is applied and the titanium oxide particles have performed phase transition to the β phase, by applying heat, the titanium oxide particles 1 can perform phase transition from the β phase and the remaining λ phase to the α phase in a predetermined temperature range. Still further, when a temperature rises and the titanium oxide particles 1 have performed phase transition to the α phase, such an α phase can perform phase transition to the λ phase again by cooling the titanium oxide particles to lower the temperature.

When irradiated with light at a room temperature, the titanium oxide particles 1 can perform phase transition from the crystalline structure of $λ$-$Ti_3O_5$ to the crystalline structure of $β$-$Ti_3O_5$. In this case, when heat is applied to rise the temperature, the titanium oxide particles 1 can perform phase transition from the λ phase and the β phase to the α phase in a temperature range of equal to or higher than about 460 K, and can perform phase transition again from the α phase to the λ phase by cooling the titanium oxide particles to lower the temperature.

The titanium oxide particles 1 can be constituted by only Ti which has a high safeness, and are formed of only Ti which is inexpensive, and thus the costs for the raw materials can be reduced as a whole.

(5) Application of Titanium Oxide Particle

Figure 10:
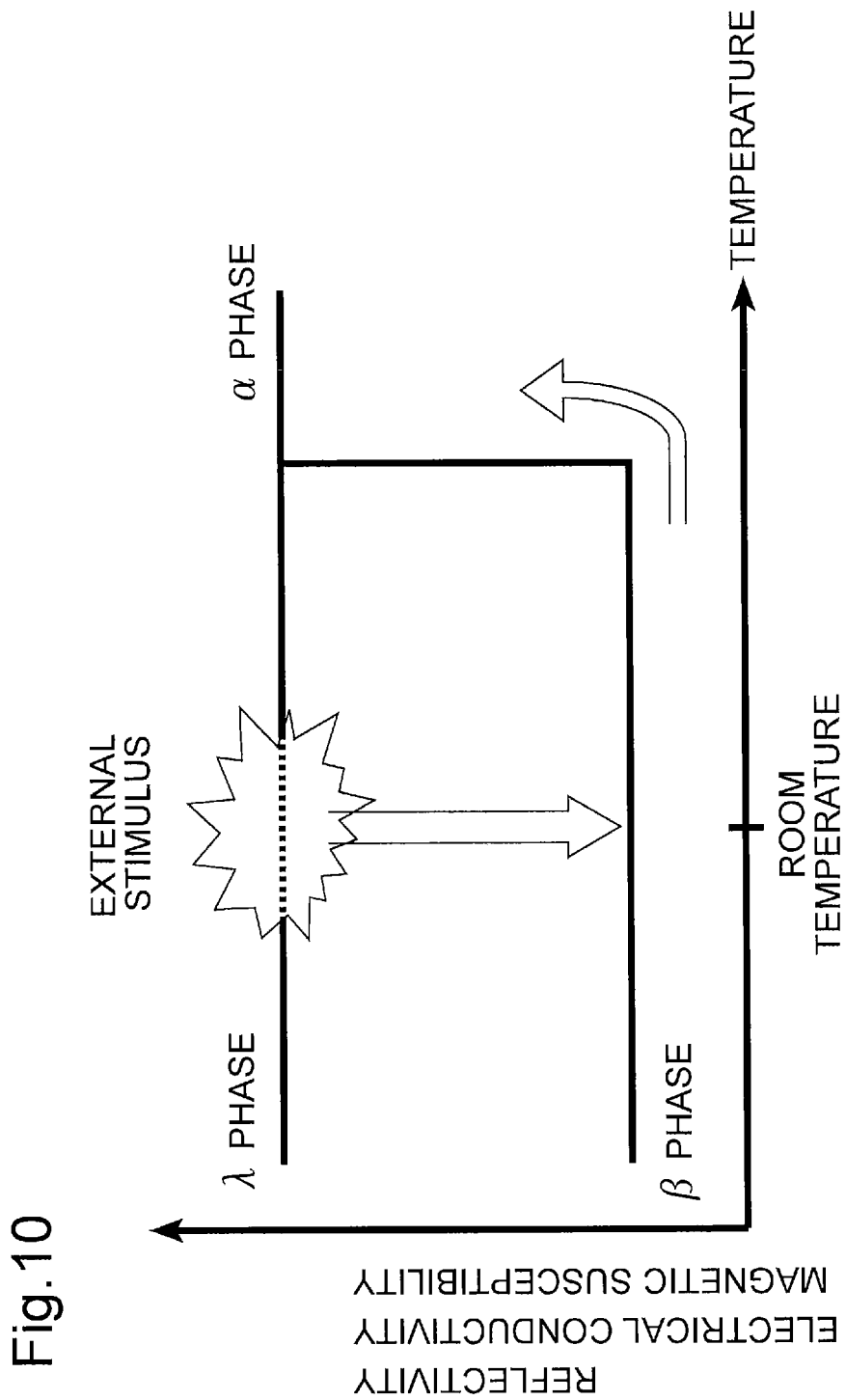
FIG. 10 is a graph for explaining an application of a titanium oxide particle.

The titanium oxide particles 1 can be used for the following applications based on the optical characteristic, the electrical conductivity, and the magnetic characteristic of the titanium oxide particles 1. As shown in FIG. 10, when the temperature is lower than about 460 K, the titanium oxide particles 1 of the present invention have a crystalline structure of the λ phase with a characteristic of a paramagnetic metal, and when an external stimulus, such as light, pressure, electromagnetic or magnetic field, is applied, the titanium oxide particles change the crystalline structure to the β phase having a characteristic as the non-magnetic semiconductor, thereby making the magnetic characteristic variable.

FIG. 10 has a horizontal axis indicating a temperature and a vertical axis indicating any one of a magnetic susceptibility, an electrical conductivity, or a reflectivity. According to the titanium oxide particle 1 of the present invention, since the paramagnetic metal state is maintained from the lower temperature range to the higher temperature range, the magnetic susceptibility, the electrical conductivity and the reflectivity are maintained relatively high from the lower temperature range to the higher temperature range. In contrast, in the β phase where the crystalline structure is changed by an external stimulus, the characteristic as the non-magnetic semiconductor is held, and thus the magnetic susceptibility, the electrical conductivity, and the reflectivity are lowered in comparison with the α phase and the λ phase. As explained above, the titanium oxide particle 1 can change the magnetic susceptibility, the electrical conductivity, and the reflectivity upon an application of an external stimulus.

Moreover, when an external stimulus is applied and the titanium oxide particle 1 has changed the phase to the β phase, the titanium oxide particle can change to the crystalline structure of the α phase having the characteristic as the paramagnetic metal upon a temperature rise, and changes the crystalline structure again from the α phase to the λ phase when the temperature is lowered thereafter. As explained above, the titanium oxide particle 1 has characteristics that cause the crystalline structure to perform phase transition from the λ phase to the β phase upon an application of an external stimulus, and to perform phase transition from the β phase to the α phase and again from the α phase to the λ phase upon a temperature change, and thus the titanium oxide particle can be available to optical switching, a magnetic memory, a charge accumulation type memory, and an optical information recording medium, etc., by utilizing such characteristics.

The titanium oxide particles 1 of the present invention can be formed in advance so as to have a little concavity and convexity in the surfaces thereof, have a small particle diameter, and have a substantially uniform and constant size of, for example, about 6 to 10 nm, and are easily separable from the silica glass 3 through the separation process. Hence, when the titanium oxide particles 1 separated from the silica glass 3 are formed as a recording layer in a film shape in a magnetic memory, a charge accumulation type memory, or an optical information recording medium, etc., since the titanium oxide particles are microparticles having a small particle diameter and have a little concavity and convexity in the surfaces thereof, the concavity and convexity in a recording surface can be reduced and such a recording surface can be made flat, and thus the recording layer can be easily made to have a uniform film thickness.

An optical information recording medium using the titanium oxide particles 1 of the present invention uses no toxic substance, such as germanium, antimony, and tellurium, used for, for example, a Blu-ray Disc (registered trademark, hereinafter, referred to as a BD), and thus the toxicity can be reduced by what corresponds to the absence of such a substance, and the costs can be reduced. Such an optical information recording medium will be discussed later in detail.

Moreover, the titanium oxide particles 1 can be used for optical switching by utilizing the characteristic of changing the crystalline structure from the $\lambda$ phase that is the paramagnetic metal state to the $\beta$ phase that is the non-magnetic semiconductor state upon application of an external stimulus when, more specifically, the external stimulus by predetermined light is applied at a room temperature.

The titanium oxide particles 1 can be used for a magnetic memory by utilizing a characteristic of changing the crystalline structure from the $\lambda$ phase that is the paramagnetic metal to the $\beta$ phase that is the non-magnetic semiconductor upon application of an external stimulus when the external stimulus, such as light, pressure, an electromagnetic or magnetic field, is applied at a room temperature.

In practice, when utilized as such a magnetic memory, the titanium oxide particles 1 are used as a magnetic material, and a magnetic layer having the magnetic material fixed on a supporting body is formed. When an external stimulus, such as light, pressure, an electric field or a magnetic field, is applied, the magnetic memory changes the crystalline structure from $\lambda$-$Ti_3O_5$ that is the paramagnetic metal to $\beta$-$Ti_3O_5$ that is the non-magnetic semiconductor upon application of the external stimulus to change the magnetic characteristic, and records information based on such a change. Hence, according to this magnetic memory, stored information can be read based on, for example, a change in the magnetic susceptibility of the magnetic layer. Therefore, a magnetic memory can be provided which utilizes the titanium oxide particles 1 as the magnetic material.

When such titanium oxide particles 1 having an electrical conductivity are dispersed in an insulator, those titanium oxide particles 1 can move charges through a hopping conduction or a tunnel conduction. Hence, the titanium oxide particles 1 are available to, for example, a charge accumulating layer like a floating gate of a charge accumulation type memory like a flash memory. Therefore, a charge accumulation type memory can be provided which utilizes the titanium oxide particles 1 as a charge accumulating material of a charge accumulating layer.

The titanium oxide particles 1 have the magnetic characteristic and the electrical conductivity, and thus having a novel magneto-electric (ME) effect, thereby available to a technology utilizing such an ME effect. Moreover, the titanium oxide particles 1 can be used for fast-speed switching through a transient photocurrent by a coupling of an optical characteristic with an electrical conductivity.

(6) Photo-Induced Phase Transition Phenomenon of Titanium Oxide Particle

In the above-explained "(3-6) Irradiated Effect by Light of Titanium Oxide Particle", the explanation was given of a fact that when a sample formed of the titanium oxide particles 1 having a crystalline structure of the $\lambda$ phase is irradiated with light having a predetermined light intensity, a portion to which such light intensity is applied changes a color and becomes the $\beta$ phase. An explanation will now be given of a case in which a sample formed of the titanium oxide particles 1 is repeatedly irradiated with light.

In this case, when the sample having become the $\beta$ phase upon irradiation with predetermined light is again irradiated with predetermined light, the portion irradiated with such light becomes again the $\lambda$ phase from the $\beta$ phase. Next, when this sample is irradiated again with predetermined light, the portion irradiated with such light returns again to the $\beta$ phase from the $\lambda$ phase. The titanium oxide particles 1 repeatedly perform phase transition from the $\lambda$ phase to the $\beta$ phase, and from the $\beta$ phase to the $\lambda$ phase every time the titanium oxide particles are irradiated with light.

(7) Thermodynamic Analysis of Titanium Oxide Particle

In order to facilitate the understanding for the production mechanism of $\lambda$-$Ti_3O_5$, a ratio (x) between Gibbs free energy G and charge delocalized units is calculated through a Slichter and Drickamer model that is a mean field theory model.

Figure 11:
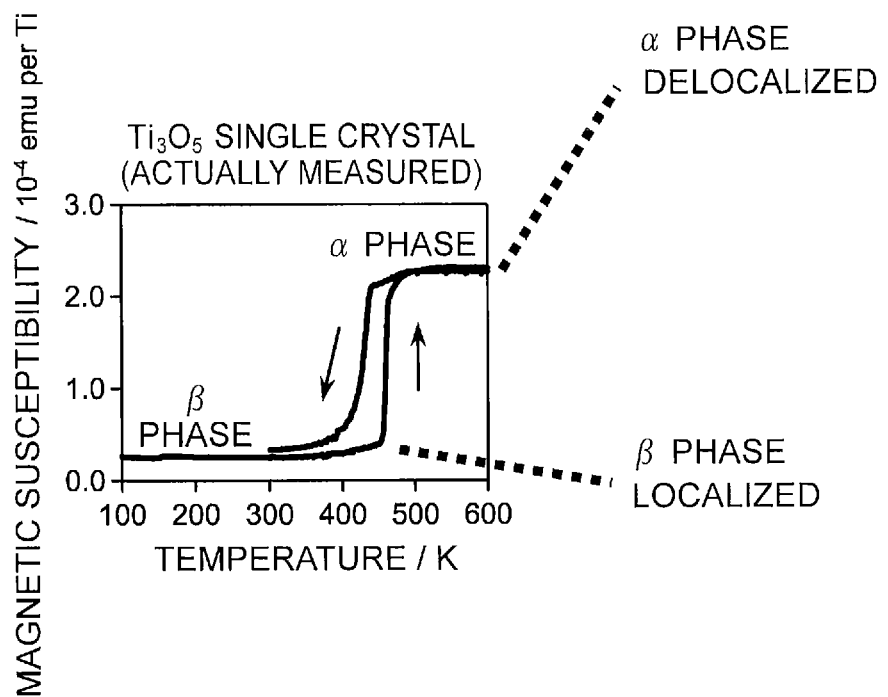
FIG. 11 is a graph showing a phase transition of a $\beta$ phase and an $\alpha$ phase due to a temperature change in $Ti_3O_5$ single crystal.

As shown in FIG. 11, in the conventional crystal ($Ti_3O_5$ single crystal) having a crystalline structure becoming $\beta$-$Ti_3O_5$ (the $\beta$ phase) when a temperature is lower than about 460 K, the primary phase transition between the $\beta$ phase and the $\alpha$ phase (a semiconductor and a metal) is regarded as a phase transition between a charge localized system (simply indicated as 'localized' in FIG. 11) and a charge delocalized system (simply indicated as 'delocalized' in FIG. 11). Accordingly, the ratio (x) between the charge localized units ($Ti^{3+}Ti^{4+}Ti^{3+}O_5$) and the charge delocalized units (($Ti)^{3-1/3}$) is considered as an order parameter. The Gibbs free energy G in the phase transition between the $\beta$ phase and the $\alpha$ phase can be described as following formula 1.

$$G = x\Delta H + \gamma x(1-x) + T\{R[x \ln x + (1-x)\ln(1-x)] - x\Delta S\} \quad \text{[Formula 1]}$$

In this case, the Gibbs free energy G of the $\beta$ phase (the charge localized type) is taken as an energy reference, x is a ratio of the charge delocalized units, $\Delta H$ is a transition enthalpy, $\Delta S$ is a transition entropy, R is a gas constant, $\gamma$ is an interaction parameter, and T is a temperature.

Figure 12A:
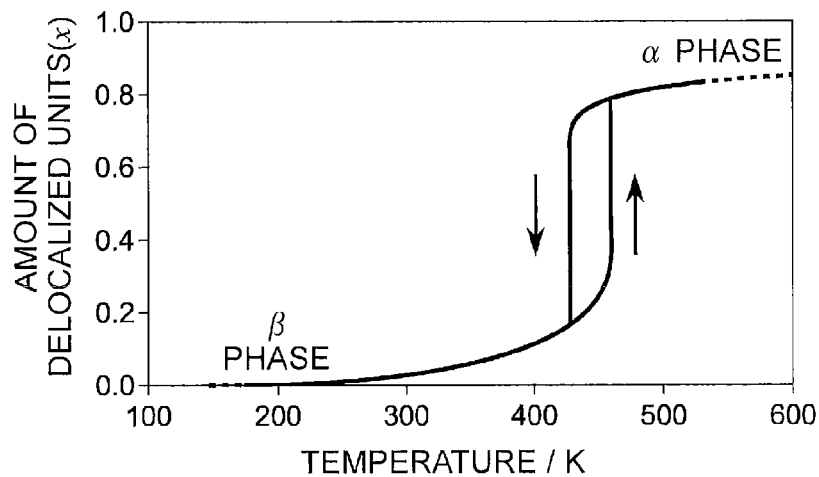
FIG. 12 are schematic views showing a relationship between a ratio of charge delocalized units of $Ti_3O_5$ single crystal and a temperature, and a relationship between Gibbs free energy and a ratio of charge delocalized units.
Figure 12B:
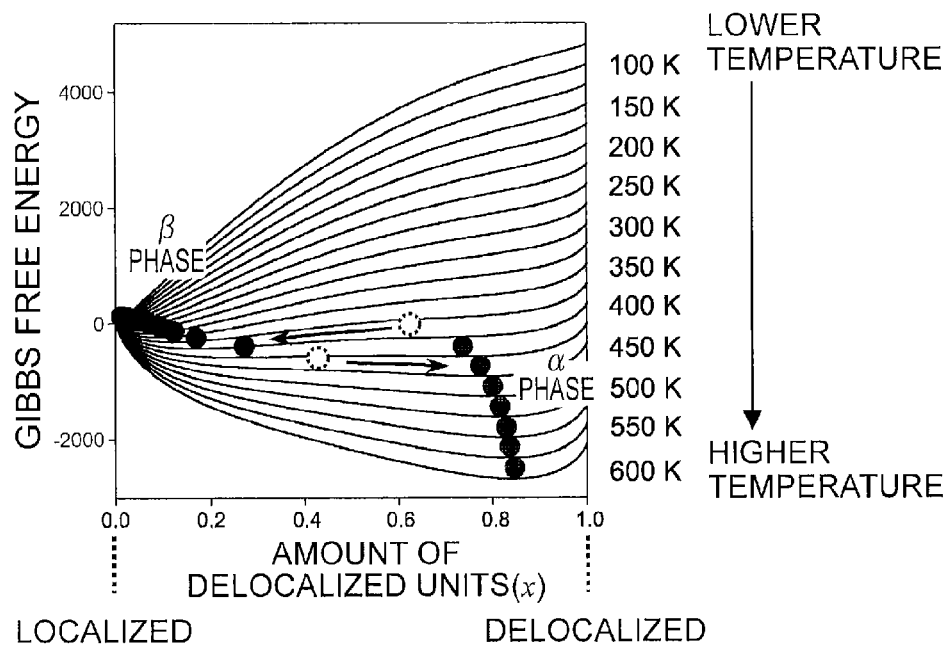

It has been reported that the transition enthalpy $\Delta H$ of the $\alpha$ phase and the $\beta$ phase is substantially 13 kJmol$^{-1}$, and the transition entropy $\Delta S$ is substantially 29 JK$^{-1}$ mol$^{-1}$. Next, applying those values, the Gibbs free energy G was calculated, a relationship among the Gibbs free energy G, the ratio x of the charge delocalized units, and the temperature was studied, and a relationship shown in FIGS. 12A and 12B was confirmed.

Conversely, in order to calculate a plot of the Gibbs free energy G of $\lambda$-$Ti_3O_5$ and the ratio x of the charge delocalized units, it is necessary to understand $\lambda$-$Ti_3O_5$ in nano size. In this example, the transition enthalpy $\Delta H$: 5 kJ mol$^{-1}$ and the transition entropy $\Delta S$: 11 JK$^{-1}$ mol$^{-1}$ in $\lambda$-$Ti_3O_5$ in nano size are adopted.

Figure 13A:
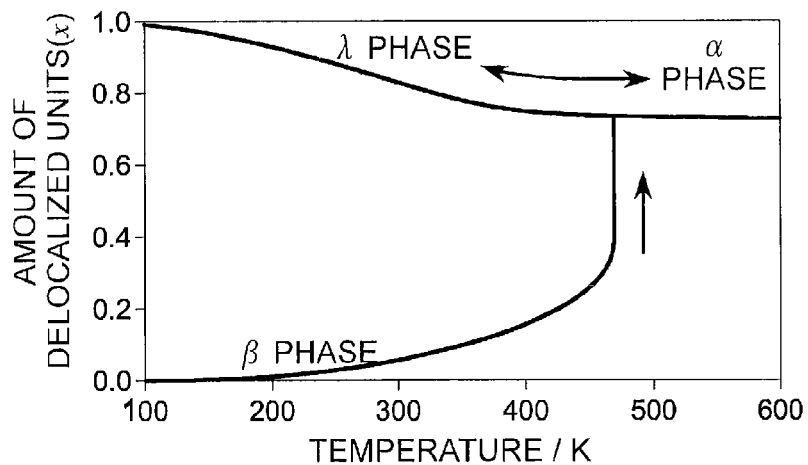
FIG. 13 are schematic views showing a relationship between a ratio of charge delocalized units of a sample formed of a $\lambda$ phase according to the present invention and a temperature, and a relationship between Gibbs free energy and a ratio of charge delocalized units.
Figure 13B:
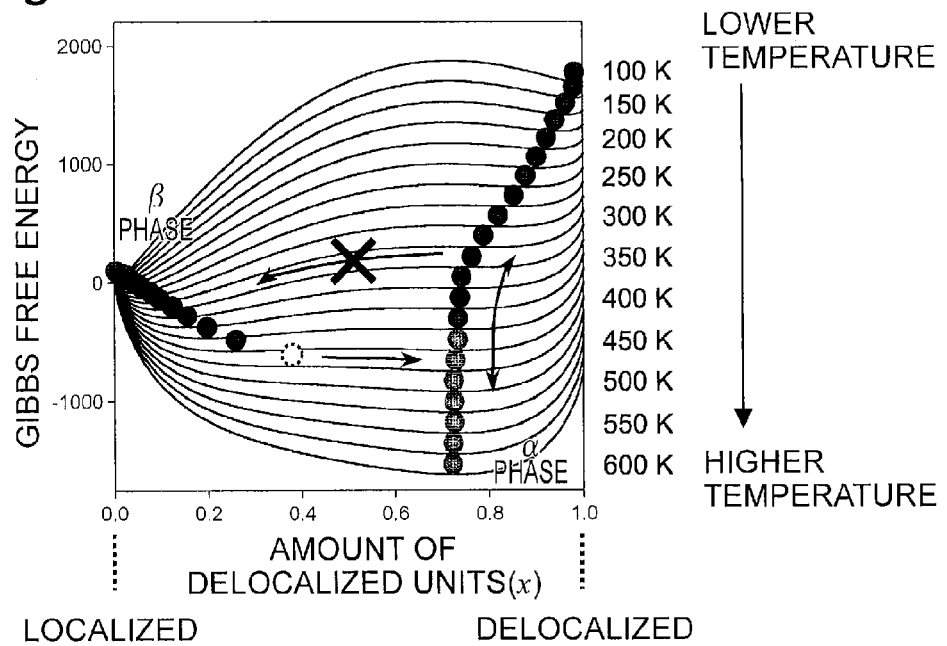
Figure 14:
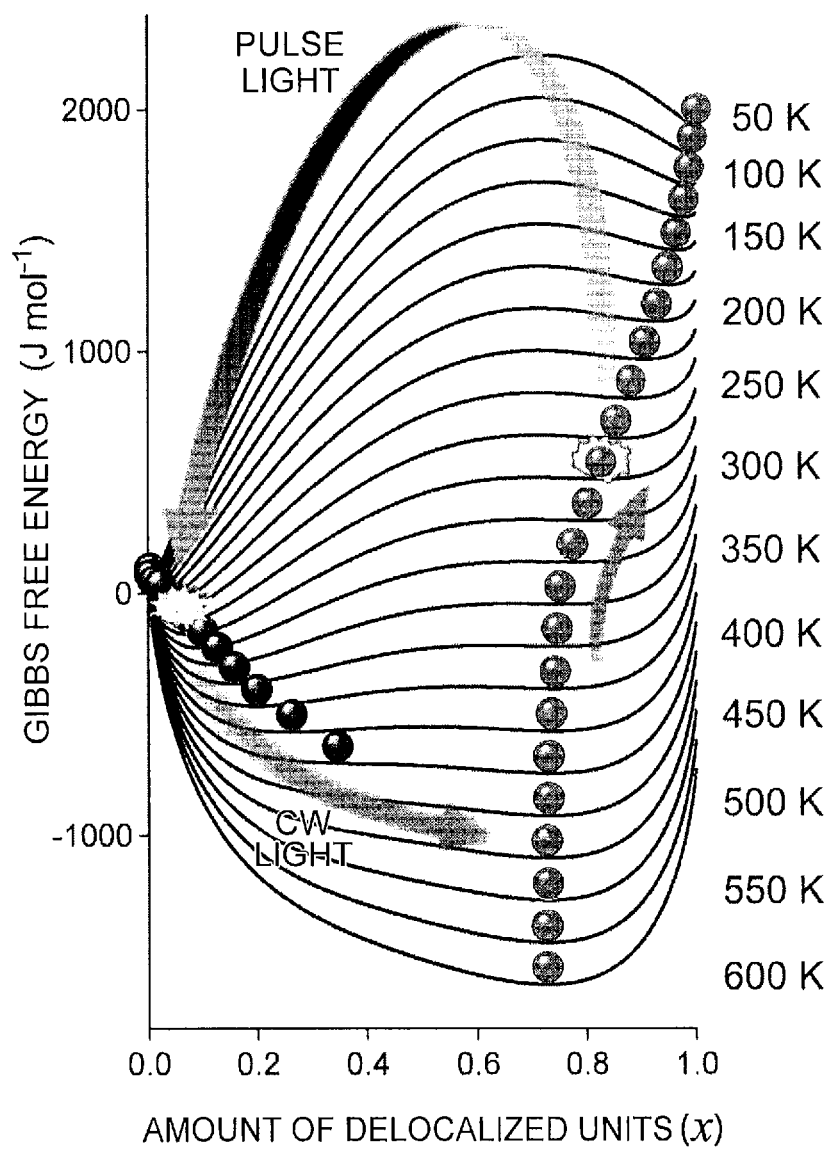
FIG. 14 is a graph showing a relationship among Gibbs free energy, a ratio of charge delocalized units, and a temperature.

Subsequently, applying those values, the Gibbs free energy G was calculated through the above-explained formula I, and a relationship among the Gibbs free energy G, the ratio x of the charge delocalized units, and the temperature was studied, and a relationship shown in FIGS. 13A and 13B was confirmed. It becomes clear from FIG. 13B that in the case of $\lambda$-$Ti_3O_5$, an energy barrier was present between the charge localized type (mainly the β phase) and the charge delocalized type (mainly the α phase and the λ phase) in all temperature ranges. Because of the presence of the energy barrier, the temperature dependency of $\lambda\text{-}Ti_3O_5$ which is a nano crystal such that $\lambda\text{-}Ti_3O_5$ does not transition to the β phase when the temperature is lowered after it has transitioned to the α phase can be explained well. In order to perform transition from the λ phase to the β phase and from the β phase to the α phase beyond such an energy barrier, as shown in FIG. 14, an external stimulus, such as pulse light or CW light, is necessary. Moreover, it becomes clear from FIGS. 13A and 13B that the β phase is a true stabilized phase at a temperature equal to or lower than 460 K in a thermal equilibrium condition.

Based on such thermodynamic analysis, it can be thought that the present photo-induced phase transition was caused through a phase collapse from the λ phase that is seemingly stable to the β phase truly stable by irradiation with pulse laser light of 532 nm. Since light absorption of the λ phase is absorption by a metal, it becomes clear that light from ultraviolet light to near-infrared light (laser light of 355 to 1064 nm) is effective to this metal-semiconductor transition.

Conversely, it can be thought that a returning reaction from the α phase to the λ phase is caused due to a light-heat process. It becomes clear that the photo-induced reverse phase transition from the β phase to the λ phase is caused by an excitation from the d orbit of Ti to the d orbit of another Ti in the band gap of the β phase, and the phase directly transitions to the λ phase or thermally is heated to the α phase and then rapidly cooled to the λ phase.

Figure 15:
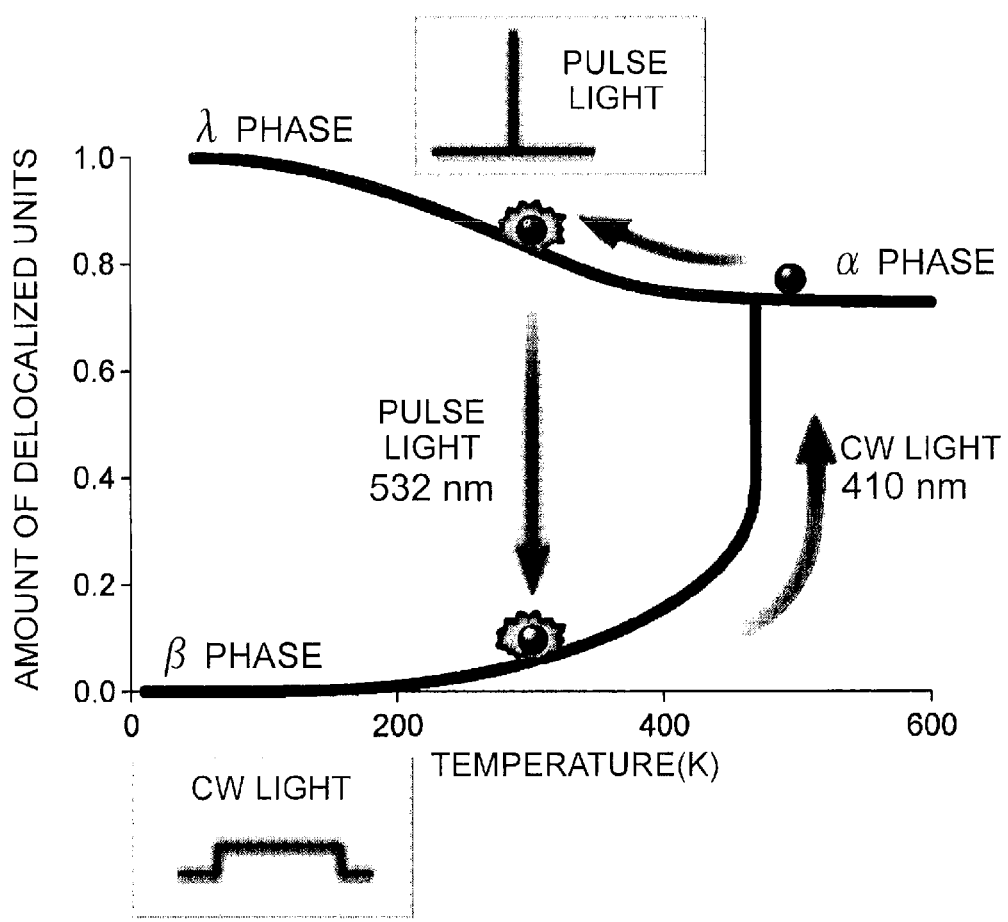
FIG. 15 is a graph showing a relationship between a temperature and a ratio of charge delocalized units at the time of light irradiation.

(8) Optical Information Recording Medium Using Titanium Oxide Particle for Recording Layer As shown in FIG. 15, the titanium oxide particle 1 of the present invention which has a small particle diameter and has a little concavity and convexity in the surface has features such that the crystalline structure can perform phase transition from the λ phase to the β phase by pulse light, perform phase transition from the β phase to the α phase by light, and perform phase transition from the α phase to the λ phase again upon lowering the temperature. Hence, the titanium oxide particle 1 can be used for a recording layer of optical information recording media, such as a CD (Compact Disc), a DVD (Digital Versatile Disc), and BD (Blu-ray Disc). In this case, the optical information recording medium is configured to be operable with three stages: initialization of the recording layer; recording of information in the recording layer; and reproduction of the information from the recording layer.

(8-1) Initialization of Optical Information Recording Medium

As a preparation for recording information, an optical information recording medium initializes all or some of recording layers of the optical information recording medium. In this case, when initialization light is emitted to one surface side of the recording layer of the optical information recording medium from an initialization light source of an optical information recording/reading device, the recording layer is initialized. The initialization light at this time has sufficient energy that can cause the light irradiated portion to perform transition to the α phase even if the light irradiated portion before the irradiation with the initialization light is either the β phase or the λ phase. In the recording layer, the portion irradiated with the initialization light performs phase transition from the β phase to the α phase, and further from the α phase to the λ phase, further performs phase transition from the λ phase to the α phase and further from the α phase to the λ phase, and when portions irradiated with the initialization light all become the λ phase, the reflectivity becomes uniform.

That is, according to the optical information recording medium, when, for example, the reflectivity of return light upon emission of light is associated with a code "0" or "1", all portions of the optical information recording medium become the uniform code "0" (or the code "1") in this stage, and thus no information is recorded at all.

(8-2) Recording of Information

When information is recorded in the optical information recording medium, recording light for recording with a predetermined light intensity is focused in the recording layer by the optical information recording/reading device. In the optical information recording medium, upon irradiation with the recording light, the crystalline structure of the titanium oxide particle 1 changes and performs phase transition from the λ phase to the β phase within a local range around the target position, and the reflectivity at the neighborhood of the focal point of the recording light (the β phase) and those of the surroundings (the λ phase) become different. As a result, the titanium oxide particle 1 performs phase transition from the λ phase to the β phase, and thus a recording mark is formed on the recording layer of the optical information recording medium.

(8-3) Reproduction of Information

When information recorded in the optical information recording medium is read, reading light for reading with a predetermined light intensity is focused in the recording layer by the optical information recording/reading device. The optical information recording medium causes the light receiving element of the optical information recording/reading device to detect return light returned from the recording layer, and the information recorded in the recording layer is reproduced because of the difference in the reflectivity due to the difference in the crystalline structure of the titanium oxide particle 1 (the presence/absence of the recording mark). The reading light output in this stage has a light intensity to some level that does not cause the titanium oxide particle 1 in the recording layer to perform phase transition from the λ phase to the β phase when the recording layer is irradiated with the reading light. In the above-explained embodiment, the explanation was given of the case in which the condition when the titanium oxide particle 1 becomes the β phase is considered as a condition in which the recording mark is formed, but the present invention is not limited to this case, and a condition in which the titanium oxide particle 1 becomes the λ phase can be considered as a condition in which the recording mark is formed. In this case, it is appropriate if the recording light, the reading light and the initialization light have a wavelength of 355 to 1064 nm.

(9) Thin-Film Synthesis Using Titanium Oxide Particle

Figure 16:
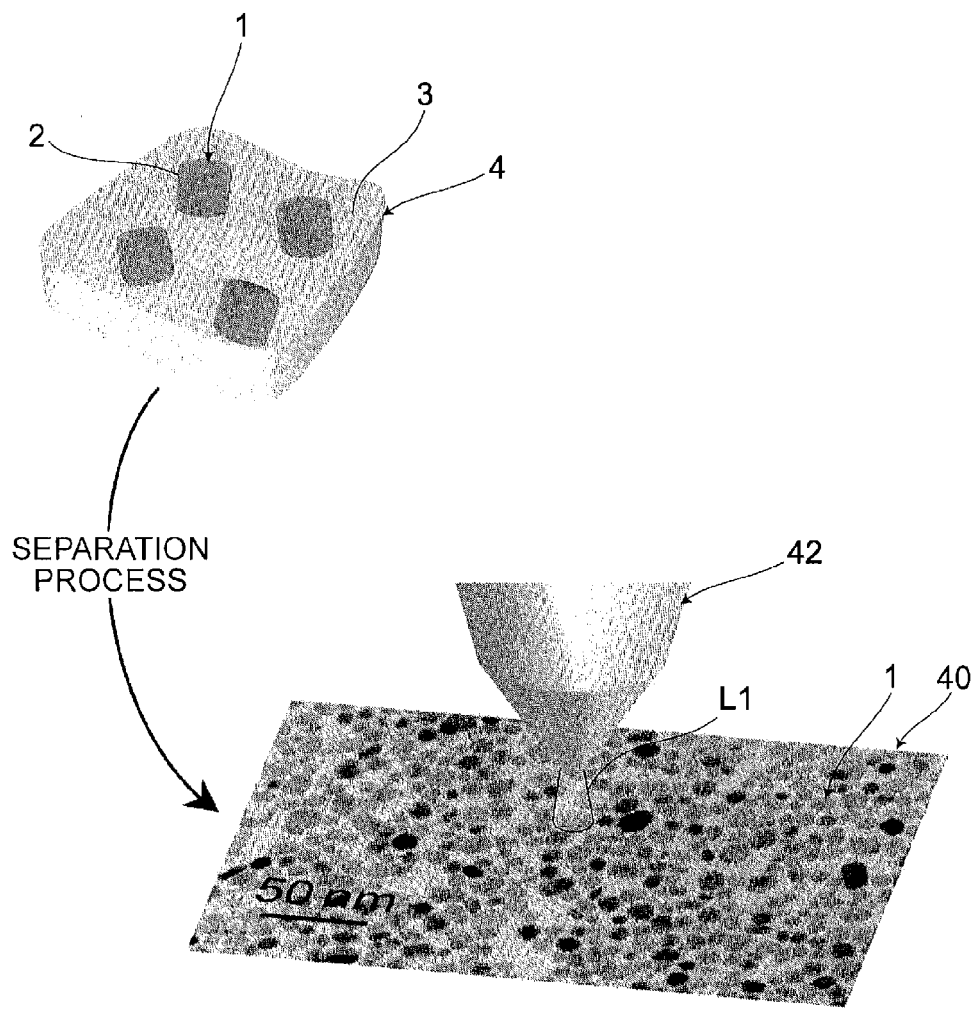
FIG. 16 is a schematic view for explaining a titanium oxide particle having silica glass removed and used for a recording layer of an optical information recording medium to be used for near-field light.

FIG. 16 is a schematic view when a recording layer 40 of an optical information recording medium used for near-field light is formed of the titanium oxide particles 1 separated from the silica glass 3. In this case, near-field light L1 emitted from an optical pickup 42 is emitted to the recording layer 40 to record or reproduce information.

Figure 17:
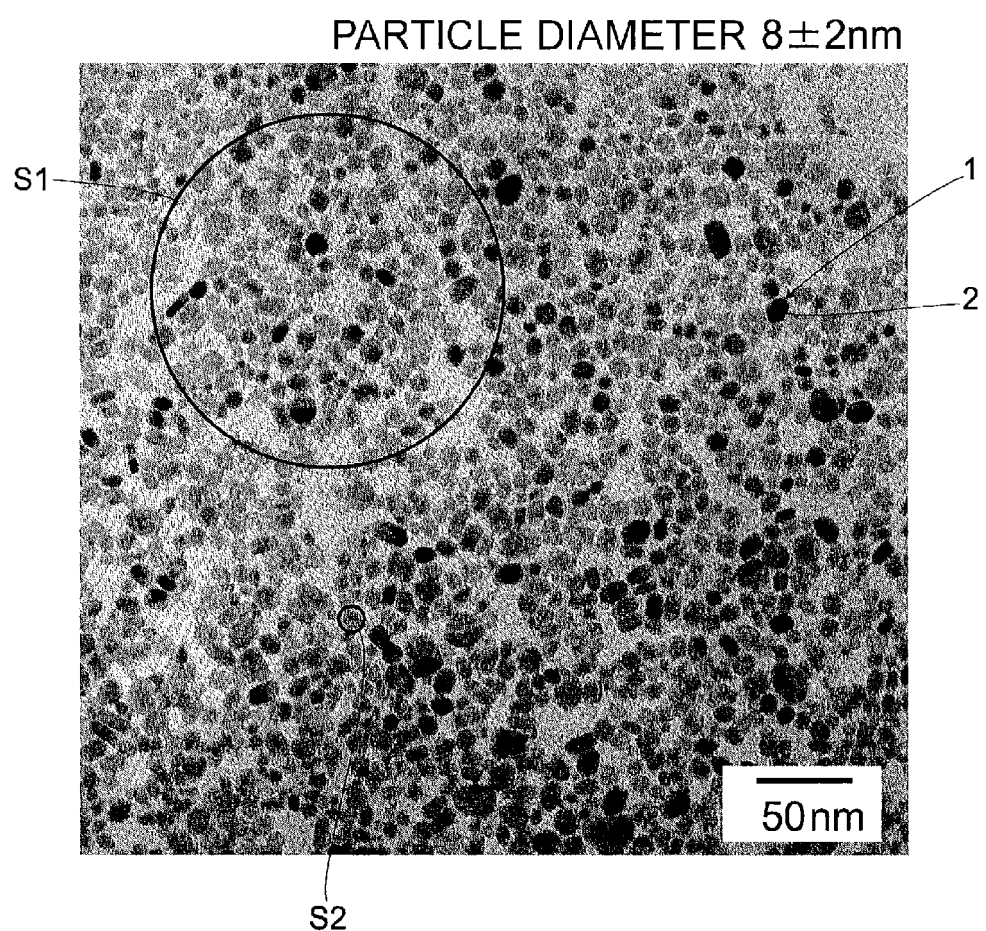
FIG. 17 is a schematic view showing an image when a titanium oxide particle is irradiated with a light spot generated by a typical optical information read/write device and a light spot by near-field light.

FIG. 17 shows an image when an optical spot S1 having a diameter of about 300 nm and used for typical optical information recording/reading devices is emitted to the titanium oxide particles 1 shown in FIG. 1, and an image when an optical spot S2 of near-field light having a diameter of about 8 nm is emitted to the titanium oxide particles. According to an optical information recording medium having the recording layer 40 formed of a plurality of titanium oxide particles 1 with a particle diameter of, for example, about 6 to 10 nm, when used in recording and reproducing near-field light, the recording density can be improved in comparison with conventional BDs.

The present invention is not limited to the above-explained embodiment, and can be changed and modified in various forms within the scope and spirit of the present invention. As long as, for example, the microstructure 4 of the titanium oxide particle 1 coated with the silica glass 3 and formed of $Ti_3O_5$ particle body 2 and which maintains the paramagnetic metal state in a temperature range from 0 to 800 K can be formed, various conditions of, for example, the sol-gel technique (e.g., the concentration of titanium tetrachloride and the concentration of ammonium), and various conditions of the calcination process, such as the calcination time, the temperature, and the hydrogen atmosphere, can be modified to other various conditions.

In the above-explained embodiment, the explanation was given of the example case in which the titanium oxide particles 1 having the silica glass 3 removed are applied to optical switching, a magnetic memory, a charge accumulation type memory, and an optical information recording medium, etc., but the present invention is not limited to this case. The titanium oxide particles 1 coated with the silica glass 3 can be applied to optical switching, a magnetic memory, a charge accumulation type memory, and an optical information recording medium, etc. That is, like the titanium oxide particles 1 having the silica glass 3 removed, the titanium oxide particles 1 coated with the silica glass 3 also have characteristics such that the crystalline structure performs phase transition from the λ phase to the β phase upon an application of an external stimulus, and performs phase transition from the β phase to the α phase, and again from the α phase to the λ phase upon a temperature change. Hence, by utilizing such characteristics, the titanium oxide particles coated with silica glass are also applicable to optical switching, a magnetic memory, a charge accumulation type memory, and an optical information recording medium, etc.

The invention claimed is:

1. A method for producing a titanium oxide particle comprising:
    a step of mixing a titanium chloride aqueous solution with an ammonium aqueous solution to prepare a mixture solution and produce a titanium hydroxide compound particle by a hydroxylation reaction in a water phase of a mixture solution;
    a step of adding a silane compound to the mixture solution to produce a silica-coated titanium hydroxide compound particle; and
    a step of calcining the silica-coated titanium hydroxide compound particle separated from the mixture solution under a hydrogen atmosphere to produce a $Ti_3O_5$ particle body in a microparticle shape which is coated with silica glass.

2. The titanium-oxide-particle manufacturing method according to claim 1, comprising a step of removing the silica glass coating the $Ti_3O_5$ particle body.

3. The titanium-oxide-particle manufacturing method according to claim 2, wherein in the step of removing the silica glass,
    the silica glass is removed from the surface of the $Ti_3O_5$ particle body by at least one of a potassium hydroxide solution in ethanol; a sodium hydroxide aqueous solution; or a tetramethylammonium hydroxide aqueous solution.

* * * * *